(12) United States Patent
Mignot et al.

(10) Patent No.: US 9,508,560 B1
(45) Date of Patent: Nov. 29, 2016

(54) SIARC REMOVAL WITH PLASMA ETCH AND FLUORINATED WET CHEMICAL SOLUTION COMBINATION

(71) Applicants: International Business Machines Corporation, Armonk, NY (US); GLOBALFOUNDRIES Inc., Grand Cayman, KY (US); STMicroelectronics, Inc., Coppell, TX (US)

(72) Inventors: Yann Mignot, Slingerlands, NY (US); Brown C. Peethala, Albany, NY (US); Shariq Siddiqui, Albany, NY (US)

(73) Assignee: International Business Machines Corporation, Armonk, NY (US)

(\*) Notice: Subject to any disclaimer, the term of this patent is extended or adjusted under 35 U.S.C. 154(b) by 0 days.

(21) Appl. No.: 14/743,511

(22) Filed: Jun. 18, 2015

(51) Int. Cl.
*H01L 21/311* (2006.01)
*H01L 21/033* (2006.01)
*H01L 21/027* (2006.01)

(52) U.S. Cl.
CPC ..... *H01L 21/31116* (2013.01); *H01L 21/0276* (2013.01); *H01L 21/0332* (2013.01); *H01L 21/0337* (2013.01); *H01L 21/31111* (2013.01); *H01L 21/31144* (2013.01)

(58) Field of Classification Search
CPC .................. H01L 21/02274; H01L 21/31116; H01L 21/0276; H01L 21/0332
See application file for complete search history.

(56) References Cited

U.S. PATENT DOCUMENTS

| 2006/0102208 A1 | 5/2006 | Jacobson et al. |
| 2011/0076623 A1 | 3/2011 | Fitrianto .................. G03F 7/427 430/323 |
| 2011/0101507 A1 | 5/2011 | Akinmade Yusuff et al. |
| 2013/0001750 A1 | 1/2013 | Arnold ................ H01L 21/3086 257/618 |
| 2014/0186774 A1 | 7/2014 | Glodde et al. |
| 2014/0187047 A1 | 7/2014 | Tagami ............... H01L 21/0276 438/703 |
| 2014/0273501 A1 | 9/2014 | Glodde et al. |
| 2015/0115418 A1 | 4/2015 | Wei ..................... H01L 21/3086 257/639 |

OTHER PUBLICATIONS

Wei, Y., et al., "Performance of tri-layer process required for 22nm and beyond", Advances in Resist Materials and Processing Technology XXVIII, Proc. SPIE 7972, Apr. 16, 2011, 12 pages, vol. 7972.
Mattson, D., et al., "Dry Strip Removal of Si-Containing Anti-Reflective Coating Photo Resist Stacks", ECS Transactions, Oct. 2011, 41 (5) pp. 263-268.
IBM, "Defect Reduction Method for Tri-layer Integration", Apr. 27, 2009, 7 pages, IP.com No. 000182345.

*Primary Examiner* — Bradley K Smith
(74) *Attorney, Agent, or Firm* — Scully, Scott, Murphy & Presser, P.C.; Steven J. Meyers

(57) ABSTRACT

A method that allows effective removal of a silicon-containing antireflective coating (SiARC) layer in a block mask after defining an unblock area in a sidewall image transfer (SIT) patterning process without causing a height loss of the SIT spacers is provided. The method includes first modifying the SiARC layer with a dry etch utilizing an etching gas comprising a nitrogen gas followed by treating the modified SiARC layer with a wet chemical etch utilizing an aqueous solution including dilute hydrofluoric acid and citric acid.

20 Claims, 9 Drawing Sheets

SIARC REMOVAL WITH PLASMA ETCH AND FLUORINATED WET CHEMICAL SOLUTION COMBINATION

BACKGROUND

The present application relates to the fabrication of semiconductor structures and, more particularly to a method of removing a silicon-containing antireflective coating (SiARC) layer in a sidewall image transfer (SIT) patterning process without causing a height loss of spacers.

Sidewall Image Transfer (SIT) is a process that doubles the density of a line pattern and is thereby very important to continued silicon technology scaling. The SIT process conventionally involves a conformal deposition of a spacer material layer over a previously patterned SIT mandrel followed by etching back the spacer material layer to form spacers on the sidewalls of the mandrels. The mandrels are then removed, leaving behind only the spacers. In certain applications, a block mask including a stack of an organic planarization layer (OPL), a silicon-containing antireflective coating (SiARC) layer, and a photoresist layer is applied over the SIT spacers. The block mask is then patterned to form a blocked area and an unblocked area. The unblock area corresponds to a region where the spacer defined pattern is transferred to an underlying metal nitride hard mask layer and eventually to the substrate. Once the block mask is patterned to expose spacers in the unblocked region, the patterned SiARC layer needs to be removed before patterning the metal nitride hard mask layer using the exposed spacers as an etch mask.

However, etching the SiARC layer selective to the spacers exposed in the unblocked area can be a challenge. For example, silicon oxide formed by a low temperature in-situ radical assisted deposition (iRAD) is commonly employed as the spacer material. In such a situation, dry etches employing fluorine-based chemistry that are suitable for SiARC removal also etch the spacers because iRAD silicon oxide and SiARC have similar material properties and are etched at similar rates. This inadvertent etching of the oxide-based spacers can reduce the spacer heights. The relatively short spacers results in a poor metal hard mask etching profile, which leads to a non-uniformity during the trench and via pattering subsequently performed. As such, there remains a need to develop a novel approach that allows removal of the SiARC layer with enhanced etch selectivity relative to the silicon oxide-based spacers.

SUMMARY

The present application provides a method that allows effective removal of a SiARC layer in a block mask after defining an unblock area in a SIT patterning process without causing a height loss of the SIT spacers. The method includes first modifying the SiARC layer with a dry etch utilizing an etching gas comprising a nitrogen gas followed by treating the modified SiARC layer with a wet chemical etch utilizing an aqueous solution including dilute hydrofluoric acid and citric acid.

In one aspect of the present application, a method of forming a semiconductor structure is provided. In one embodiment, the method includes first forming a plurality of sidewall image transfer (SIT) spacers over a metal nitride hard mask layer located over at least one underlying material layer. Next, a patterned stack that includes a patterned silicon-containing antireflective coating (SiARC) layer overlying a patterned organic planarization layer (OPL) is formed over the SIT spacers and the metal nitride hard mask layer. The patterned stack exposes at least one portion of the plurality of SIT spacers. After exposing the patterned SiARC layer to an etching gas including a nitrogen gas to modify the patterned SiARC layer, the modified patterned SiARC layer is treated with an aqueous solution including dilute hydrofluoric acid to remove the modified patterned SiARC layer from a top surface of the patterned OPL.

In another embodiment, the method includes first forming a plurality of sidewall image transfer (SIT) spacers over a metal nitride hard mask layer, wherein the metal nitride hard mask layer is located over a dielectric hard mask layer overlying at least one underlying material layer. A patterned stack that comprises a patterned silicon-containing antireflective coating (SiARC) layer overlying a patterned organic planarization layer (OPL) is formed over the SIT spacers and the metal nitride hard mask layer. The patterned stack exposes at least one portion of the plurality of SIT spacers. Next, the metal nitride hard mask layer is patterned employing the exposed portion of the plurality of SIT spacers as an etch mask. After exposing the patterned SiARC layer to an etching gas comprising a nitrogen gas to modify the patterned SiARC layer, the modified patterned SiARC layer is treated with an aqueous solution comprising dilute hydrofluoric acid to remove the modified patterned SiARC layer from a top surface of the patterned OPL.

DETAILED DESCRIPTION

Figure 1:
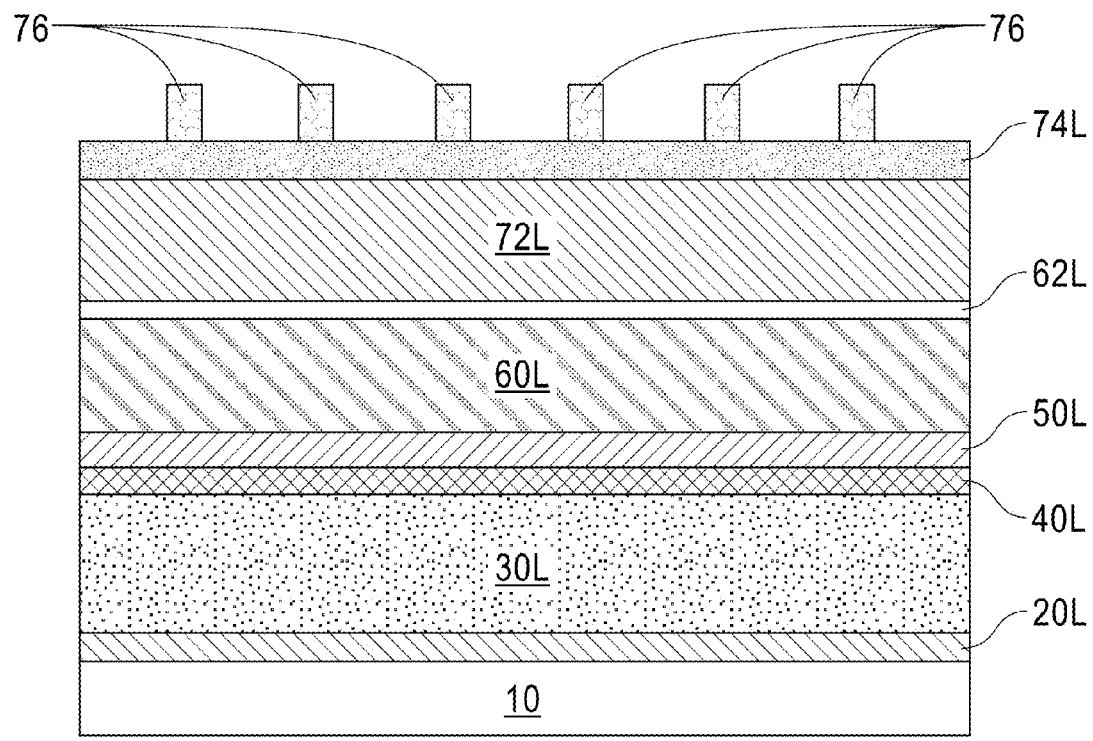
FIG. 1 is a cross-sectional view of an exemplary semiconductor structure after forming a material stack including, from bottom to top, a dielectric cap layer, a dielectric material layer, a dielectric hard mask layer, a metal nitride hard mask layer, a mandrel material layer, a mandrel cap layer, a first organic planarization layer (OPL), a first silicon-containing antireflective (SiARC) layer and a first photoresist layer containing a first pattern therein over a substrate according to an embodiment of present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes a substrate 10 and a stack of material layers formed thereupon. In one embodiment, the substrate 10 may include a semiconductor substrate having semiconductor devices (not shown) therein. The semiconductor devices can include, for example, field effect transistors, junction transistors, diodes, resistors, capacitors, inductors, or any other semiconductor device known in the art. In another embodiment, the substrate 10 may include contact-level dielectric material layers (not shown) and/or interconnect level dielectric material layers (not shown) as well as embedded contact via structures (not shown) and/or embedded wiring level metal interconnect structures. Alternately, the topmost portion of the substrate 10 can include a semiconductor material such as single crystalline silicon.

The material layer stack formed on the substrate 10 may include, for example, an optional dielectric cap layer 20L, a dielectric material layer 30L, a dielectric hard mask layer 40L, a metal nitride hard mask layer 50L, a mandrel material layer 60L, an optional mandrel cap layer 62L, a first organic planarizing layer (OPL) 72L, and a first silicon-containing antireflective coating (ARC) layer.

The optional dielectric cap layer 20L, if present, can protect an underlying structure from impurities that may diffuse down from upper levels, and can function as a diffusion barrier layer that prevents vertical diffusion of metallic impurities, moisture, or other gaseous impurities. The optional dielectric cap layer 20L may include, for example, silicon nitride, silicon oxynitride, silicon carbide, nitrogen and hydrogen doped silicon carbide (SiCNH), or a combination thereof. The optional dielectric cap layer 20L may be formed, for example, by chemical vapor deposition (CVD) or atomic layer deposition (ALD). The thickness of the optional dielectric cap layer 20L can be from 10 nm to 30 nm, although lesser and greater thicknesses can also be employed.

The dielectric material layer 30L may include a low-k dielectric material. The term "low-k" denotes a dielectric material having a dielectric constant that 4.0 or less. Exemplary low-k dielectric materials include, but are not limited to, silicon oxide, organosilicates, silsequioxanes, undoped silicate glass (USG), fluorosilicate glass (FSG), borophosphosilicate glass (BPSG), and hydrogenated carbon doped silicon oxide (SiCOH). The dielectric material layer 30L may be formed by CVD, plasma enhanced chemical vapor deposition (PECVD) or spin coating. The thickness of the dielectric material layer 30L can be from 100 nm to 1,000 nm, although lesser and greater thicknesses can also be employed.

The dielectric hard mask layer 40L may include a dielectric material, which can be silicon oxide, silicon nitride, silicon oxynitride, organosilicate, or a combination thereof. The dielectric hard mask layer 40L may be formed, for example, by PECVD, CVD or ALD. The thickness of the dielectric hard mask layer 40L can be from 15 nm to 50 nm, although lesser and greater thicknesses can also be employed.

The metal nitride hard mask layer 50L may include TiN, TiON, TaN, WN, BN, a combination thereof, or a stack thereof. In one embodiment, the metal nitride hard mask layer 50L is composed of TiN. The metal nitride hard mask layer 50L may be formed, for example, by CVD, physical vapor deposition (PVD), ALD, or a combination thereof. The thickness of the metal nitride hard mask layer 50L can be from 10 nm to 60 nm, although lesser and greater thicknesses can also be employed.

The mandrel material layer 60L may include any material that can be removed selective to the materials of the metal nitride hard mask layer 50L and a spacer material layer subsequently formed. In one embodiment, the mandrel material layer 60 includes spin-on carbon (SOC), diamond-like carbon, polyarylene ether, or polyimide, amorphous carbon. The mandrel material layer 60L may be deposited, for example, by CVD or spin coating. The thickness of the mandrel material layer 60L can be from 30 nm to 300 nm, although lesser and greater thicknesses can also be employed.

The optional mandrel cap layer 62L may include a dielectric material such as, for example, silicon nitride, silicon oxide, or silicon oxynitride and may be formed by CVD or PVD. The thickness of the mandrel cap layer 62L can be from 10 nm to 50 nm, although lesser and greater thicknesses can also be employed.

The first OPL 72L may include a self-planarizing organic planarization material, which can be a polymer layer with sufficiently low viscosity so that the top surface of the first OPL 72L is a planar horizontal surface. The self-planarizing organic planarization material can be any material employed for an organic planarization layer in trilayer lithography methods known in the art, such as, for example, spin-on carbon (SOC), diamond-like carbon, polyarylene ether, or polyimide. The first OPL 72L may be formed, for example, by spin coating. The thickness of the first OPL 72L can be from 10 nm to 200 nm, although lesser and greater thicknesses can also be employed.

The first SiARC layer 74L may include a silicon-containing polymer. In one embodiment, the first SiARC layer 74L comprises silicon at an atomic concentration from 1% to 50%. The first SiARC layer 74L may be applied, for example, by spin coating. The thickness of the first SiARC layer 74L can be from 10 nm to 150 nm, although lesser and greater thicknesses can also be employed.

A first photoresist layer containing a first pattern (herein referred to as a patterned first photoresist layer 76) is formed on the top surface of the first SiARC layer 74L. The first photoresist layer (not shown) may be formed, for example, by spin coating. The thickness of the first photoresist layer can be from 200 nm to 600 nm, although lesser and greater thicknesses can also be employed. The first photoresist layer can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons.

The first photoresist layer is lithographically patterned to form the first pattern therein. The first pattern can be a line pattern including multiple parallel lines that define mandrel structures subsequently formed. In one embodiment, the multiple parallel lines can have the same width and the same pitch. The width of the multiple parallel lines can be from 10 nm to 50 nm, although lesser and greater widths can also be employed. The pitch of the multiple parallel lines is a lithographic pitch, i.e., a pitch that can be printed by a single lithographic exposure employing a commercially available lithography tool and photoresist. In one embodiment, the pitch of the multiple parallel lines can be from 50 nm to 200 nm, although lesser and greater pitches can also be employed.

Figure 2:
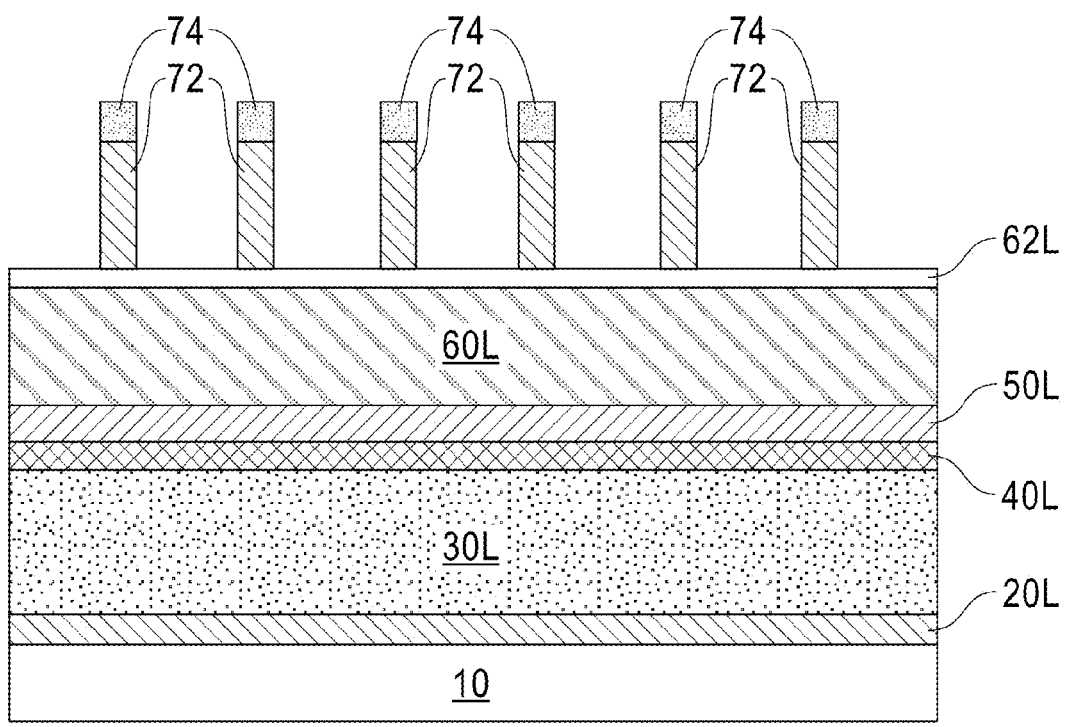
FIG. 2 is a cross-sectional view of the exemplary semiconductor structure of FIG. 1 after transferring the first pattern into the first SiARC layer and the first OPL to provide a patterned first SiARC layer and a patterned first OPL.

Referring to FIG. 2, the first pattern in the first photoresist layer is transferred through the first SiARC layer 74L and the first OPL 72L by a pattern transfer etch, which can be an anisotropic etch. In one embodiment, the pattern transfer etch can be a reactive ion etch (RIE) that removes the materials of the first SiARC layer 74L and the first OPL 72L selective to the material of the mandrel cap layer 62L, if present, or the mandrel material layer 60. The remaining portions of the first SiARC layer 74L constitute the patterned first SiARC layer 74. The remaining portions of the first OPL 72L constitute the patterned first OPL 72. After transferring the first pattern into the first SiARC layer 74L and the first OPL 72L, the patterned first photoresist layer 76 may be removed by a conventional strip process such as, for example, ashing.

Figure 3:
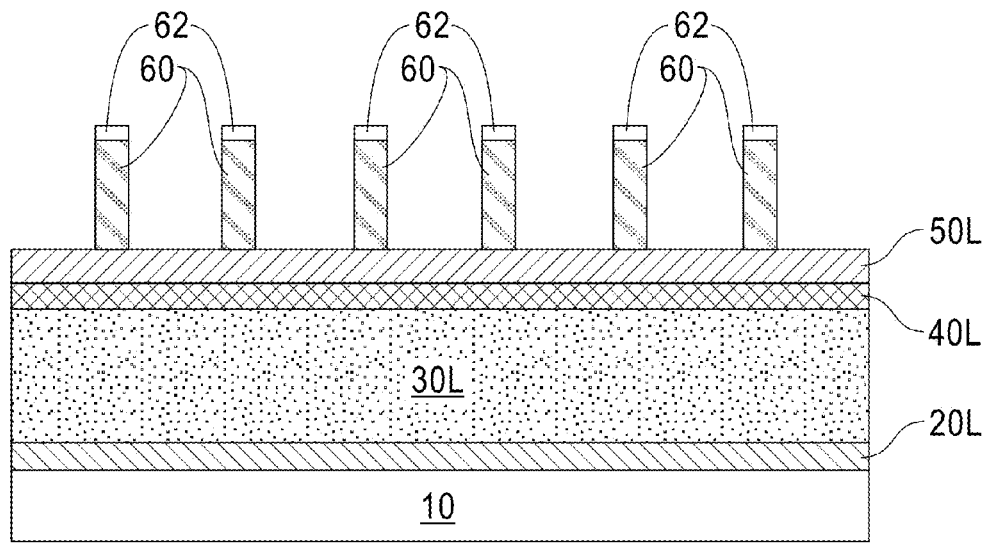
FIG. 3 is a cross-sectional view of the exemplary semiconductor structure of FIG. 2 after forming vertical stacks of mandrel caps and mandrel structures.

Referring to FIG. 3, mandrel structures 60 are formed by employed the patterned first SiARC layer 74 and the patterned first OPL 72 as an etch mask. In some embodiments of the present application, each mandrel structure 60 may have a mandrel cap 62 located atop the mandrel structure 60 if the mandrel cap layer 62L is present in the structure.

The mandrel structures 60 and the mandrel cap 62, if present, may be formed by removing portions of the mandrel material layer 60L and the mandrel cap layer 62L, if present, that are not covered by the patterned first SiARC layer 74 and the patterned first OPL 72 by at least one etch, which can be a dry etch or a wet chemical etch. In one embodiment, RIE may be employed to remove the exposed portions of the mandrel cap layer 62L, if present, or the mandrel material layer 60L selective to the metal nitride hard mask layer 50L. Remaining portions of the mandrel material layer 60L constitute the mandrel structures 60. Remaining portions of the mandrel cap layer 62L constitute the mandrel caps 62. After forming the mandrel structures 60, the patterned first SiARC layer 74 and the patterned first OPL 72 may be removed by a dry etch or a wet chemical etch.

Figure 4:
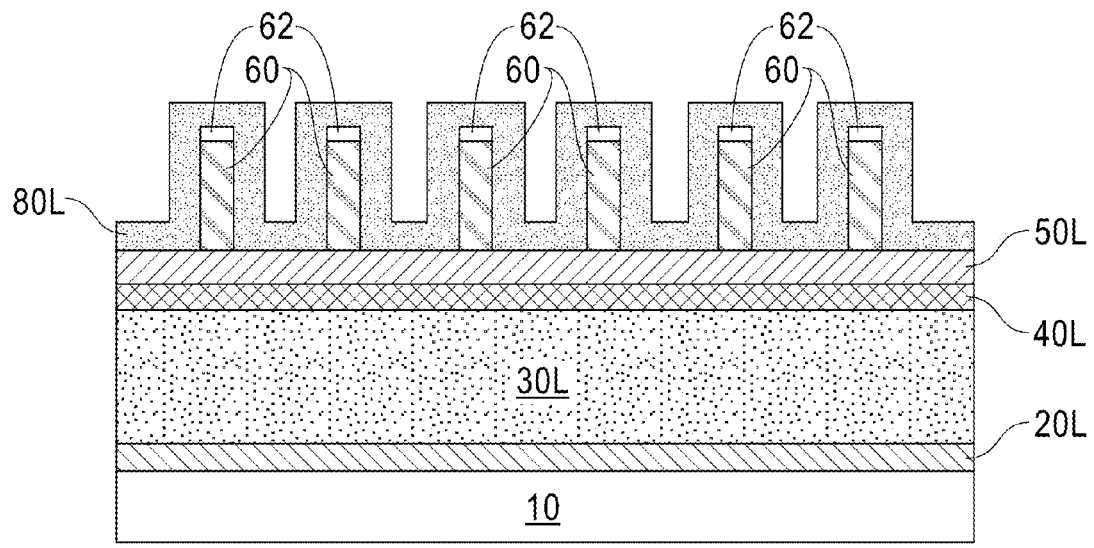
FIG. 4 is a cross-sectional view of the exemplary semiconductor structure of FIG. 3 after conformally depositing a spacer material layer over the vertical stacks of mandrel caps and mandrel structures and the metal nitride hard mask layer.

Referring to FIG. 4, a spacer material layer 80L is conformally deposited over vertical stacks of mandrel structures 60 and the mandrel cap 62, if present, and exposed surfaces of the metal nitride hard mask layer 50L. The spacer material layer 80L may include a iRAD material such as, for example a iRAD silicon oxide and may be formed by a conformal deposition process, such as, for example, ALD or CVD. The thickness of the spacer material layer 80L may vary depending upon the desired width of final structures to be formed, and can be from 5 nm to 50 nm, although lesser and greater thicknesses can also be employed.

Figure 5:
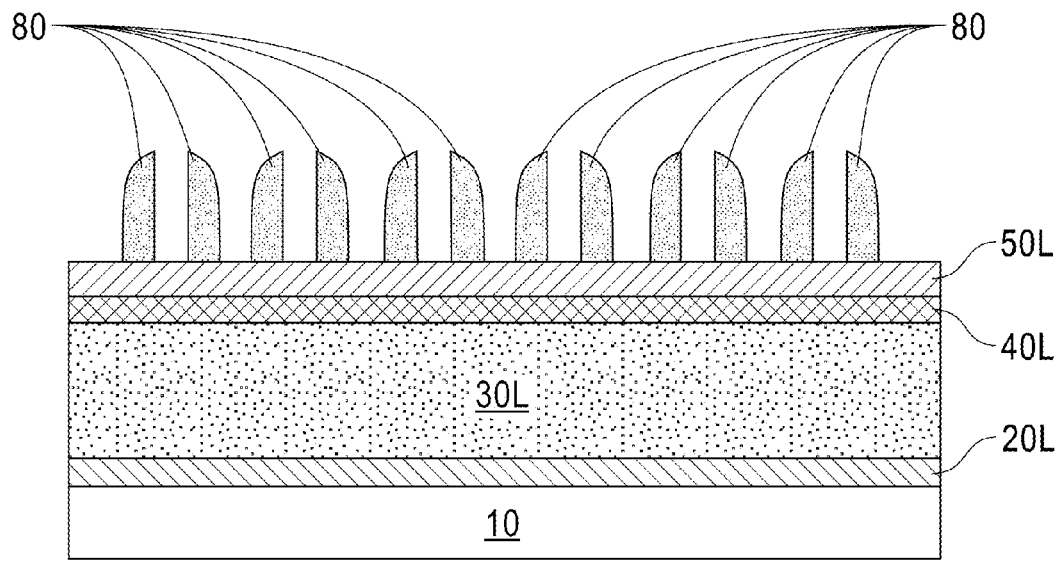
FIG. 5 is a cross-sectional view of the exemplary semiconductor structure of FIG. 4 after forming spacers.

Referring to FIG. 5, horizontal portions of the spacer material layer 80L are removed to provide spacers 80 (also referred to as SIT spacers). Each spacer 80 comprises a remaining portion of the spacer material layer 80L on each sidewall of vertical stacks of mandrel structures 60 and the mandrel cap 62, if present. The removal of the horizontal portions of the spacer material layer 80L can be achieved utilizing an anisotropic dry etch, such as, for example, RIE.

After removal of the horizontal portions of the spacer material layer 80L, the topmost surface of each vertical stack of mandrel structure 60 and the mandrel cap 62, if present is exposed and is coplanar with a topmost surface of each spacer 80. A width of each spacer 80, as measured at its base, can be from 5 nm to 50 nm, although lesser and greater thicknesses can also be employed.

Referring to FIG. 5, the mandrel structures 60 and the mandrel cap 62 are removed from the structure, thus leaving spacers 80 protruding from the top surface of the metal nitride hard mask layer 50L. The mandrel structures 60 and the mandrel caps 62 may be removed by at least one etch, which can be a dry etch or a wet chemical wet, selective to the materials of the spacers 80 and the metal nitride hard mask layer 50L. The at least one etching process can be an anisotropic or an isotropic etch.

Figure 6:
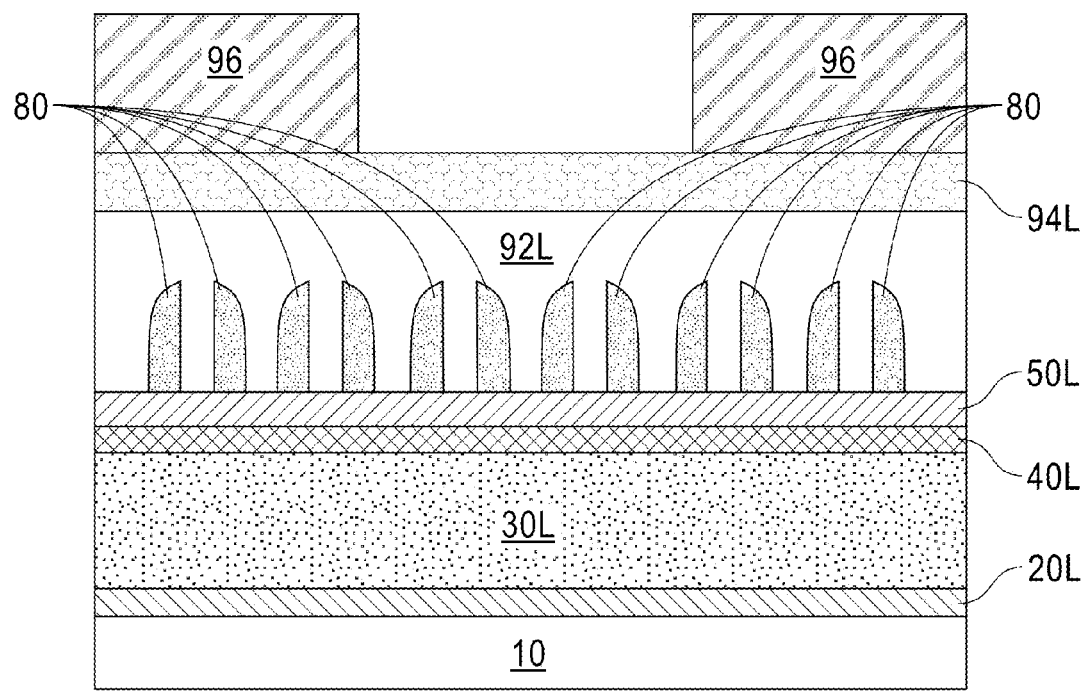
FIG. 6 is a cross-sectional view of the exemplary semiconductor structure of FIG. 5 after forming a second OPL over the spacers and the metal nitride hard mask layer, a second SiARC layer over the second OPL and a second photoresist layer containing a second pattern therein over the second SiARC.

Referring to FIG. 6, a block mask including, from bottom to top, a second OPL 92L, a second SiARC layer 94L and a second photoresist layer (not shown) is applied over the metal nitride hard mask layer 50L and the SIT spacers 80 by spin coating. The second photoresist layer is lithographically patterned to form a second pattern therein. The remaining portions of the second photoresist layer constitute the patterned second photoresist layer. The second pattern includes at least one opening. The at least one opening defines an unblocked area. The spacers 80 underlying the unblocked area are employed as an etch mask for the subsequent etching of the metal nitride hard mask layer 50L. The area that is covered by the remaining portions of the second photoresist layer (herein referred to as the patterned second photoresist layer 96) after lithographic exposure and development is referred to as the blocked area.

Figure 7:
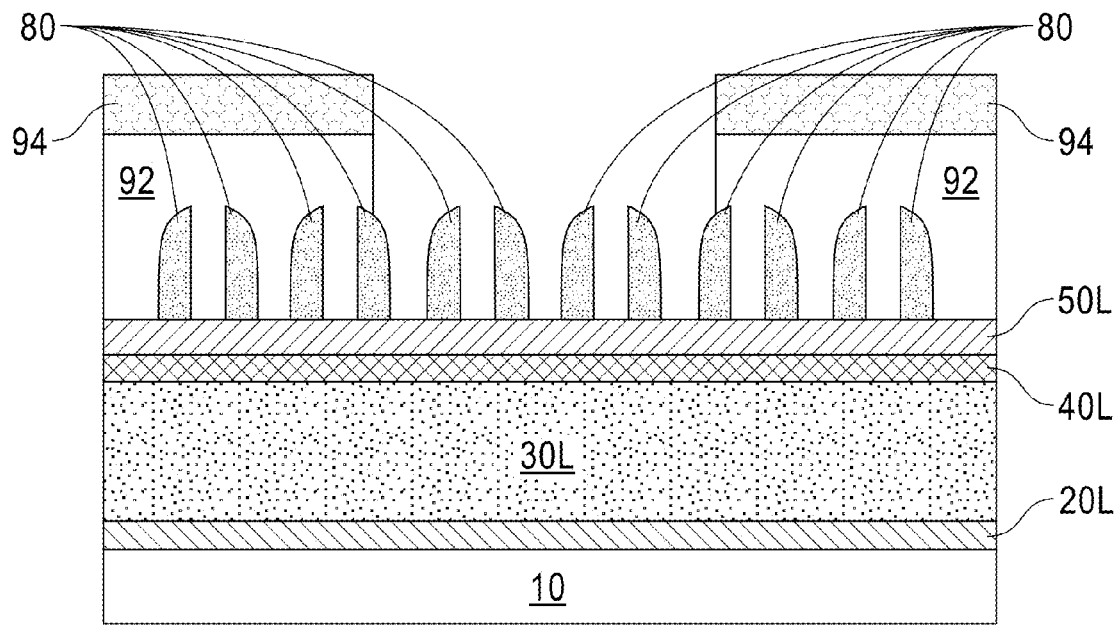
FIG. 7 is a cross-sectional view of the exemplary semiconductor structure of FIG. 6 after transferring the second pattern in the second photoresist layer into the second SiARC layer and the second OPL to provide a patterned second SiARC layer and a patterned second OPL.

Referring to FIG. 7, the second pattern is transferred into the second SiARC layer 94L and the OPL 92L. The second SiARC layer 94L and the OPL 92L may be etched by an anisotropic etch that employs the patterned second photoresist layer 96 as an etch mask. The anisotropic etch can be a dry etch such as, for example, RIE. Portions of the second SiARC layer 94L and the underlying OPL 92L that are exposed in the unblocked area are thus removed selective to the materials of the spacers 80 and the metal nitride hard mask layer 50L. The remaining portions of the second SiARC layer 94L constitute the patterned second SiARC layer 94. The remaining portions of the second OPL 92L constitute the patterned second OPL 92. If not consumed during the etching of the second SiARC layer 94L and the OPL 92L, after transferring the second pattern into the second SiARC layer 94L and the OPL 92L, the patterned second photoresist layer 96 may be removed by ashing.

Figure 8:
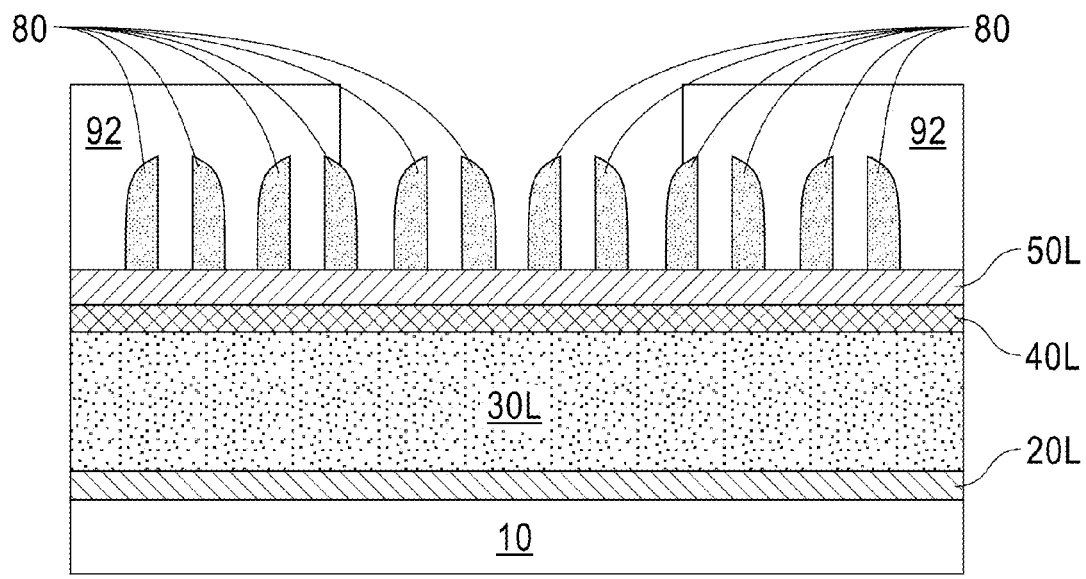
FIG. 8 is a cross-sectional view of the exemplary semiconductor structure of FIG. 7 after removing the patterned second SiARC layer utilizing a combination of a dry etch and a wet chemical etch.

Referring to FIG. 8, the patterned second SiARC layer 94 is removed employing a combination of a dry etch and a wet chemical etch. First, a dry etch is performed to modify the patterned second SiARC layer 94 by exposing the patterned second SiARC layer 94 to an etching gas containing a nitrogen gas or a mixture of nitrogen and hydrogen gases. The etching gas incorporates nitrogen into the patterned second SiARC layer 94 to deplete carbon therein. Because the etching gas employed in the present application does not include a fluorine-containing gas, such as, for example, a fluorocarbon gas that is used in the conventional SiARC removal process, the nitrogen-based dry etch chemistry employed in the present application does not etch the patterned second SiARC layer 94 and spacers 80 as in the case of the conventional SiARC removal process; rather it only modifies the SiARC material so the patterned second SiARC layer 94 can be removed with a wet chemistry subsequently performed. Such wet chemistry removes the patterned second SiARC layer 94 selective to the spacers 80.

Next, the modified patterned second SiARC layer 94 is removed selective to the metal nitride hard mask layer 50L, the patterned second OPL 92 and the spacers 80 by a wet chemical etch employing an aqueous solution of dilute hydrofluoric (HF) acid and citric acid. In some embodiments of the present application, ultra-dilute HF acid is used. As used herein, the term "ultra-dilute" means 1 part hydrofluoric acid mixed with at least 100 parts of deionized water. The ratio between the HF acid and the deionized water can be in the range of 1:50 to 1:10000. The citric acid concentration can be from 0.1 wt % to 2 wt %. In one embodiment, the ultra dilute HF acid is about one part of HF to 1300 parts water, and the aqueous solution includes 1 wt % of citric acid. The temperature of the aqueous solution during the wet chemical etch can be from 20° C. to 70° C. The combined dry and wet etch chemistries of the present application do not attack the spacers 80 exposed in the unblocked area, thus preventing the dimension change of the spacers encountered in the conventional SiARC removal process.

Figure 9A:
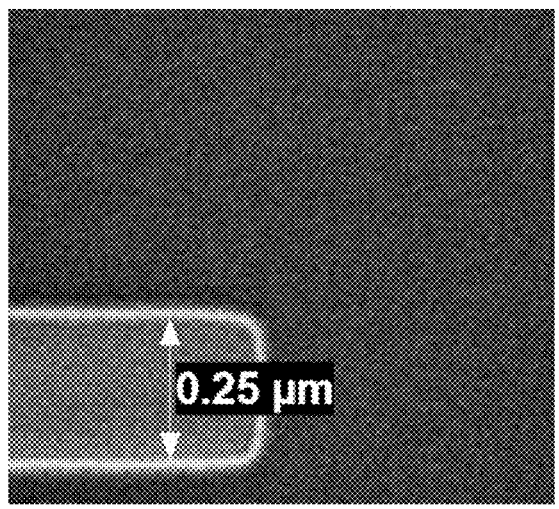
FIG. 9A is a scanning electron microscope (SEM) image illustrating a dimension of a SIT spacer before applying the combination of the dry etch and the wet chemical etch to the patterned second SiARC layer.
Figure 9B:
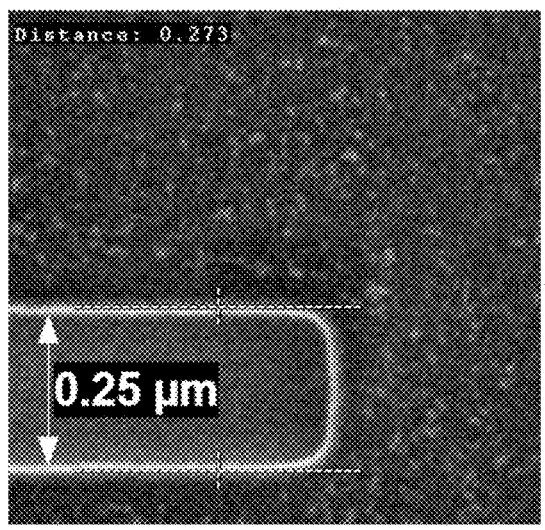
FIG. 9B is a SEM image illustrating the dimension of the SIT spacer after applying the combination of the dry etch and the wet chemical etch to partially remove the patterned second SiARC layer.
Figure 9C:
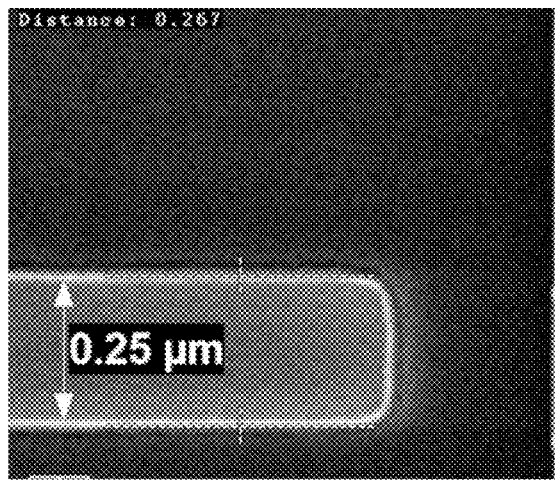
FIG. 9C is a SEM image illustrating the dimension of the SIT spacer after completely removing the patterned second SiARC layer employing the combination of the dry etch and the wet chemical etch of the present application.

FIG. 9A is a SEM image showing a dimension of a spacer 80 before removing the patterned second SiARC layer 94. FIG. 9B is a SEM image showing the dimension of the spacer 80 after partial removal of the patterned second SiARC layer 94 employing the combination of the dry etch and the wet chemical etch of the present application. FIG. 9C is a SEM image showing the dimension of the spacer 80 after complete removal of the patterned second SiARC layer 94 employing the combination of the dry etch and the wet chemical etch of the present application. As shown in FIGS. 9A, 9B and 9C, the dimensions of the spacer 80 remain the same before, and after, the SiARC removal process. Thus, the combined etch chemistries of the present application can remove the SiARC material without causing any spacer oxide loss.

Figure 10:
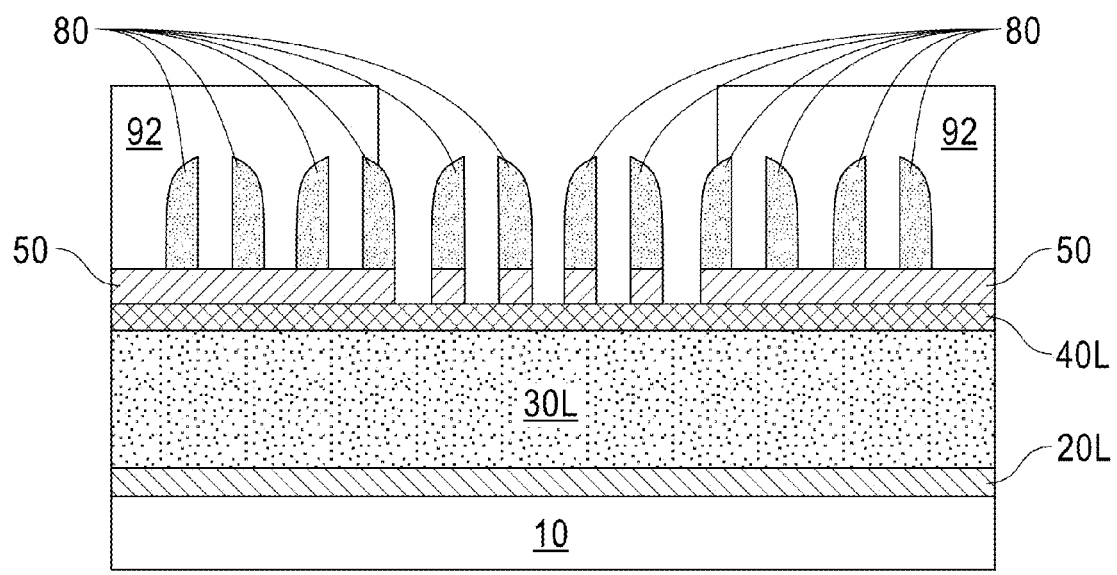
FIG. 10 is a cross-sectional view of the exemplary semiconductor structure of FIG. 8 after etching the metal nitride hard mask layer using the spacers as an etch mask.

Referring to FIG. 10, the metal nitride hard mask layer 50L is etched by an anisotropic etch using the spacers 80 exposed in the unblocked area as an etch mask. The anisotropic etch can be a dry etch or a wet chemical etch that removes the material of the metal nitride hard mask layer 50L selective to the dielectric hard mask layer 40L. In one embodiment, a chlorine-containing gas can be employed to etch the metal nitride hard mask layer 50L. The remaining portions of the metal nitride hard mask layer 50L constitute the patterned metal nitride hard mask layer 50. After transferring the spacer pattern into the metal nitride hard mask layer 50L, the patterned OPL 92 and the spacers 80 may be removed, for example, by a dry etch or a wet chemical etch.

Figure 11A:
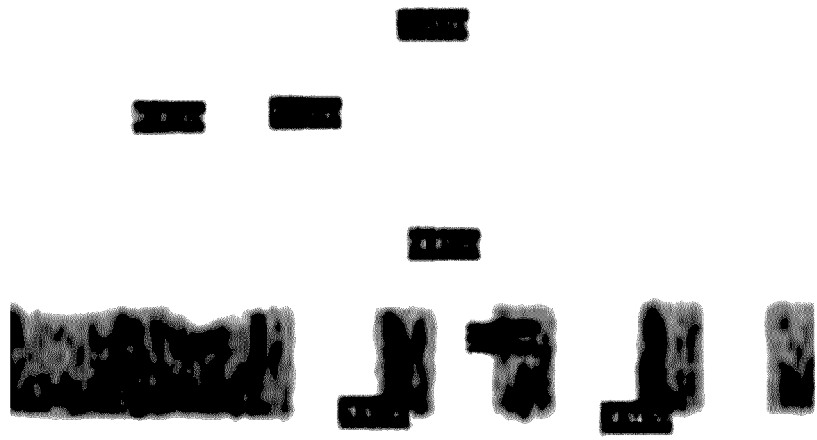
FIG. 11A is a SEM image illustrating a metal hard mask pattern obtained by using spacers of the present application as an etch mask, wherein the combination of the dry etch and the wet chemical etch of the present application employed to remove the SiARC material does not reduce the heights of the spacers.
Figure 11B:
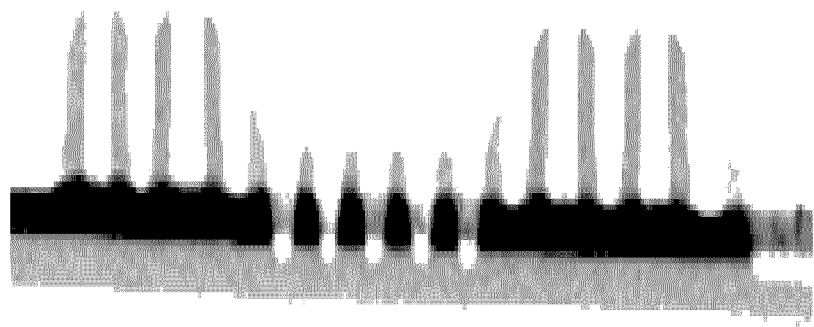
FIG. 11B is a SEM image illustrating a metal hard mask pattern profile obtained by using spacers of the prior art as an etch mask, wherein the dry etch employed in the conventional process to remove the SiARC material reduces the heights of the spacers.

Referring to FIGS. 11A and 11B, SEM images are provided to compare the metal hard mask pattern profile (FIG. 11A) of the present application in which the SiARC material is removed by a combination of a dry etch and a wet chemical etch to that of the metal hard mask pattern profile (FIG. 11B) of the conventional SIT patterning process in which the SiARC material is removed by a fluorine-based dry etch. The SEM image of FIG. 11A shows that the pattern that is formed in the metal nitride hard mask layer 50L has the desired profile due to the better preservation of the spacers 80 in the unblocked area. In comparison and as shown in FIG. 11B, the conventional fluorine-based dry etch simultaneously etch the spacers exposed in the unblocked areas when removing the SiARC material, thus the heights of the spacers exposed in the unblocked areas are reduced. This leads to the overetch of the metal nitride hard mask layer. As a result, a poor pattern profile is obtained in the metal nitride hard mask layer.

Figure 12:
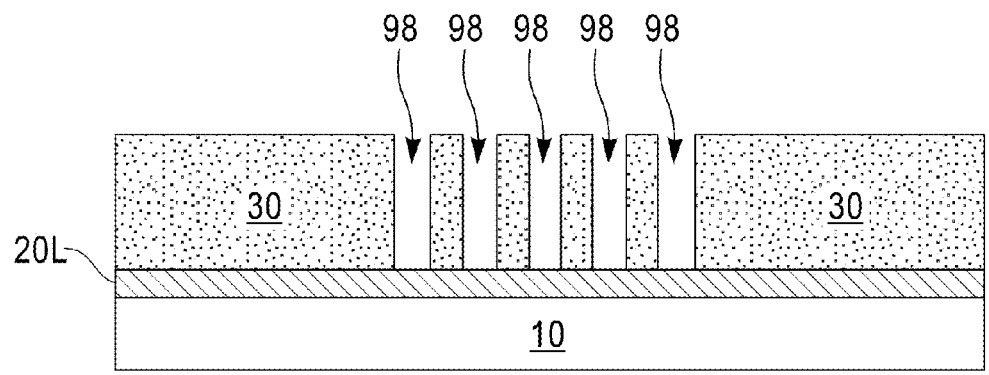
FIG. 12 is a cross-sectional view of the exemplary semiconductor structure of FIG. 10 after forming line trenches in the dielectric material layer.

Referring to FIG. 12, the pattern in the metal nitride hard mask layer 50L is transferred into the underlying dielectric layers, i.e., the dielectric hard mask layer 40L and the dielectric material layer 30L by at least one etch that employs the patterned metal nitride hard mask layer 50 as an etch mask. The remaining portions of the dielectric hard mask layer 40L constitute the patterned dielectric hard mask layer 40. The remaining portions of the dielectric material layer 30L constitute the patterned dielectric material layer 30. After transferring the pattern into the underlying dielectric layers, the patterned metal nitride hard mask layer 50 and the patterned dielectric hard mask layer 40 may be removed by a recess etch or a planarization process such as, for example, by chemical mechanical polishing (CMP). Line trenches 98 are thus formed in the dielectric material layer 30L.

Subsequently, a conductive material layer (not shown) may be deposited in the line trenches 98 and planarized to provide interconnect structures (not shown).

Figure 13:
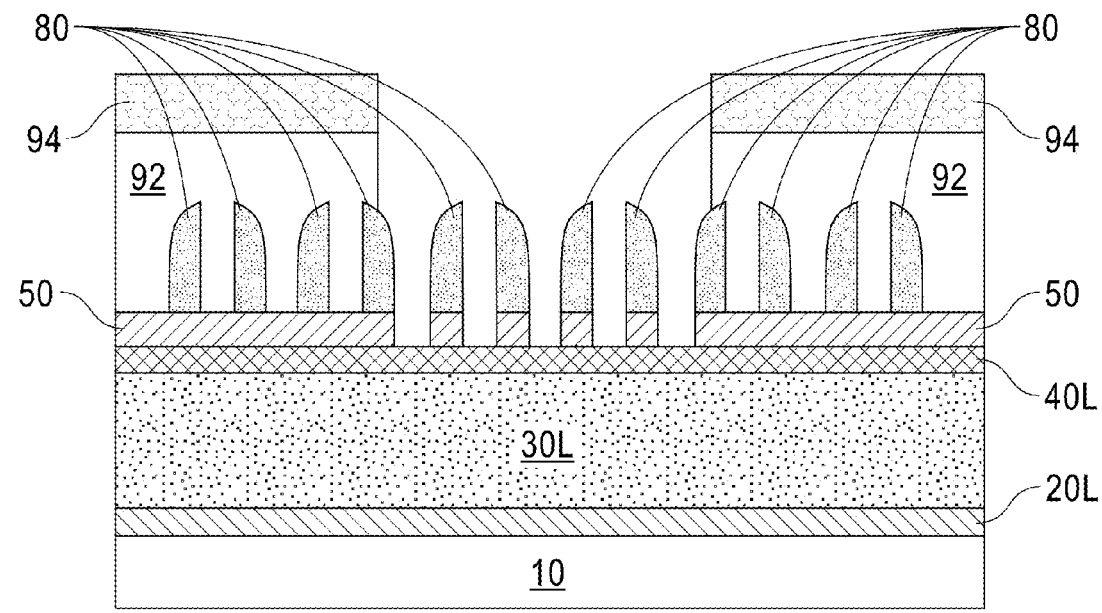
FIG. 13 is a cross-sectional view of a variation of the exemplary semiconductor structure of FIG. 7 after pattering the metal nitride hard mask layer using the spacers as an etch mask.

Referring to FIG. 13, a variation of the exemplary semiconductor structure can be derived from the exemplary semiconductor structure of FIG. 7 by patterning the metal nitride hard mask layer 50L prior to the removal of the patterned second SiARC layer 94 by performing the processing steps of FIG. 10. The patterning of the metal nitride hard mask layer 50L exposes portions of the dielectric material hard mask layer 40L. Subsequently, processing steps of FIGS. 8 and 12 can be performed to remove the patterned second SiARC layer 94 and to etch the dielectric material hard mask layer 40L and the dielectric material layer 30L, thus forming line trenches 98 in the dielectric material layer 30L. The combined dry and wet etch chemistries of the present application can remove the SiARC material without attacking the exposed portions of the dielectric hard mask layer 40L.

It should be noted that although the above description and drawings illustrate employing the combination of a dry etch and a wet chemical etch to remove the SiARC material in a SIT process, such combined etching approach can also be used in a SiARC rework process.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming a plurality of sidewall image transfer (SIT) spacers over a metal nitride hard mask layer located over at least one underlying material layer;
    forming a patterned stack that comprises a patterned silicon-containing antireflective coating (SiARC) layer overlying a patterned organic planarization layer (OPL) over the SIT spacers and the metal nitride hard mask layer, the patterned stack exposing at least one portion of the plurality of SIT spacers;
    exposing the patterned SiARC layer to an etching gas comprising a nitrogen gas to modify the patterned SiARC layer; and
    treating the modified patterned SiARC layer with an aqueous solution comprising dilute hydrofluoric acid to remove the modified patterned SiARC layer from a top surface of the patterned OPL, wherein the dilute hydrofluoric acid comprises a part of hydrofluoric acid and 50 to 10000 parts of deionized water.

2. The method of claim 1, wherein the etching gas further comprises a hydrogen gas.

3. The method of claim 1, wherein the etching gas is fluorine free and does not include a fluorocarbon gas.

4. The method of claim 1, wherein the aqueous solution further comprises citric acid.

5. The method of claim 1, wherein the plurality of SIT spacers comprises a low temperature dielectric oxide.

6. The method of claim 1, wherein the metal nitride hard mask layer comprises TiN, TiON, TaN, WN, BN, a combination thereof, or a stack thereof.

7. The method of claim 1, wherein the patterned OPL comprises spin-on carbon (SOC), diamond-like carbon, polyarylene ether, or polyimide.

8. The method of claim 1, wherein the etching gas does not etch the SIT spacers.

9. The method of claim 8, wherein the aqueous solution removes the patterned SiARC layer selective to the SIT spacers, the patterned OPL, and the metal nitride hard mask layer.

10. The method of claim 1, wherein the forming the patterned stack comprises:
    forming an OPL over the SIT spacers and the metal nitride hard mask layer;
    forming a SiARC layer over the OPL;
    forming a patterned photoresist layer over the SiARC layer, the patterned photoresist layer having at least one opening therein;
    transferring the pattern of the at least one opening into the SiARC layer and the OPL layer to provide the patterned SiARC layer and the patterned OPL layer; and
    removing the patterned photoresist layer from the patterned OPL layer.

11. The method of claim 1, wherein the forming the plurality of SIT spacers comprises:
    forming a mandrel material layer over the metal nitride hard mask layer;
    patterning the mandrel material layer to provide a plurality of mandrel structures;
    conformally depositing a spacer material layer over the plurality of mandrel structures and metal nitride hard mask layer;
    removing horizontal portions of the spacer material layer by an anisotropic etch; and
    removing the plurality of mandrel structures.

12. The method of claim 11, wherein the patterning the mandrel material layer comprises:
    forming another OPL over the mandrel material layer;
    forming another SiARC layer over the OPL;
    forming another photoresist layer over the another OPL;
    patterning the another photoresist layer;
    transferring a pattern in the patterned another photoresist layer into the another SiARC layer and the another OPL; and
    patterning the mandrel material layer employing remaining portions of the another SiARC layer and the another OPL as an etch mask.

13. The method of claim 12, further comprising:
    forming a mandrel cap layer over the mandrel material layer prior to the patterning the mandrel material layer, wherein the another OPL is formed over the mandrel cap layer, and the method further comprises patterning the mandrel cap layer employing the remaining portions of the another SiARC layer and the another OPL as an etch mask to provide a mandrel cap atop each of the plurality of mandrel structures.

14. The method of claim 1, further comprising etching the metal nitride hard mask layer employing the patterned OPL as an etch mask to provide a patterned metal nitride hard mask layer.

15. The method of claim 14, further comprising removing the patterned OPL from the patterned metal nitride hard mask layer.

16. The method of claim 15, wherein the at least one underlying material layer comprises a dielectric hard mask layer located underneath the metal nitride hard mask layer, and a dielectric material layer located underneath the dielectric hard mask layer, and a dielectric cap layer located underneath the dielectric material layer.

17. The method of claim 16, wherein the at least one underlying material layer is located over a substrate, and the method further comprises etching the dielectric hard mask layer and the dielectric material layer using the patterned metal nitride hard mask layer as an etch mask.

18. A method of forming a semiconductor structure comprising:
    forming a plurality of sidewall image transfer (SIT) spacers over a metal nitride hard mask layer, wherein the metal nitride hard mask layer is located over a dielectric hard mask layer overlying at least one underlying material layer;
    forming a patterned stack that comprises a patterned silicon-containing antireflective coating (SiARC) layer overlying a patterned organic planarization layer (OPL) over the SIT spacers and the metal nitride hard mask layer, the patterned stack exposing at least one portion of the plurality of SIT spacers;

patterning the metal nitride hard mask layer employing the exposed portion of the plurality of SIT spacers as an etch mask;

exposing the patterned SiARC layer to an etching gas comprising a nitrogen gas to modify the patterned SiARC layer, wherein the etching gas does not etch the SIT spacers and the dielectric hard mask layer; and treating the modified patterned SiARC layer with an aqueous solution comprising dilute hydrofluoric acid to remove the modified patterned SiARC layer from a top surface of the patterned OPL.

19. The method of claim 18, wherein the dilute hydrofluoric acid comprises a part of hydrofluoric acid and 50 to 10000 parts of deionized water.

20. A method of forming a semiconductor structure comprising:

forming a plurality of sidewall image transfer (SIT) spacers over a metal nitride hard mask layer located over at least one underlying material layer;

forming a patterned stack that comprises a patterned silicon-containing antireflective coating (SiARC) layer overlying a patterned organic planarization layer (OPL) over the SIT spacers and the metal nitride hard mask layer, the patterned stack exposing at least one portion of the plurality of SIT spacers;

exposing the patterned SiARC layer to an etching gas comprising a nitrogen gas to modify the patterned SiARC layer, wherein the etching gas does not etch the SIT spacers; and treating the modified patterned SiARC layer with an aqueous solution comprising dilute hydrofluoric acid to remove the modified patterned SiARC layer from a top surface of the patterned OPL.

* * * * *

UNITED STATES PATENT AND TRADEMARK OFFICE
CERTIFICATE OF CORRECTION

| | | |
|---|---|---|
| PATENT NO. | : 9,508,560 B1 | Page 1 of 1 |
| APPLICATION NO. | : 14/743511 | |
| DATED | : November 29, 2016 | |
| INVENTOR(S) | : Yann Mignot et al. | |

It is certified that error appears in the above-identified patent and that said Letters Patent is hereby corrected as shown below:

On the Title Page

Item (73) should read:

International Business Machines Corporation, Armonk, NY (US)
GLOBALFOUNDRIES Inc., Grand Cayman (KY)
STMicroelectronics, Inc., Coppell, TX (US)

Signed and Sealed this
Seventh Day of February, 2017

Michelle K. Lee
*Director of the United States Patent and Trademark Office*